(12) United States Patent
Wieczorek

(10) Patent No.: US 7,260,180 B2
(45) Date of Patent: Aug. 21, 2007

(54) X-RAY EXAMINATION APPARATUS

(75) Inventor: Herfried Karl Wieczorek, Aachen (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 29 days.

(21) Appl. No.: 10/535,058

(22) PCT Filed: Oct. 27, 2003

(86) PCT No.: PCT/IB03/04818

§ 371 (c)(1),
(2), (4) Date: May 13, 2005

(87) PCT Pub. No.: WO2004/047179

PCT Pub. Date: Jun. 3, 2004

(65) Prior Publication Data

US 2006/0056593 A1    Mar. 16, 2006

(30) Foreign Application Priority Data

Nov. 19, 2002    (EP) .................................. 02079795

(51) Int. Cl.
*H05G 1/58*    (2006.01)
(52) U.S. Cl. ........................ 378/116; 378/98.8; 378/19
(58) Field of Classification Search .................. 378/19, 378/98.8, 116, 147, 150, 151; 250/370.08, 250/370.09, 370.14
See application file for complete search history.

(56) References Cited

U.S. PATENT DOCUMENTS

| 6,262,408 | B1 | 7/2001 | Izumi et al. .............. 250/208.1 |
| 6,724,855 | B2 * | 4/2004 | Sugawara et al. ............ 378/19 |
| 2001/0005409 | A1 * | 6/2001 | Gohno et al. .................. 378/19 |
| 2002/0043696 | A1 | 4/2002 | Sarakinos et al. .......... 257/459 |
| 2002/0181661 | A1 * | 12/2002 | Vafi et al. .................... 378/207 |

* cited by examiner

*Primary Examiner*—Courtney Thomas

(57) ABSTRACT

An x-ray examination apparatus comprises an x-ray source and an x-ray detector. The x-ray detector includes a photoconductor to derive electric charges from incident x-radiation and read-out elements which derive electrical pixel-signals from the electric charges from the photoconductor. A central group of the read-out elements is located in a central region of the x-ray detector and a peripheral group of the read-out elements is located in a peripheral region which surrounds the central region. The x-ray examination apparatus being provided with a selection system to select the central group of read-out elements so as to supply pixel-signals from the central group of read-elements to the output circuit. The selection system may include an encompassing electrode to drain electric charges from the peripheral group. Or the selection system shields the peripheral group from x-rays.

7 Claims, 3 Drawing Sheets

X-RAY EXAMINATION APPARATUS

Figure 1:
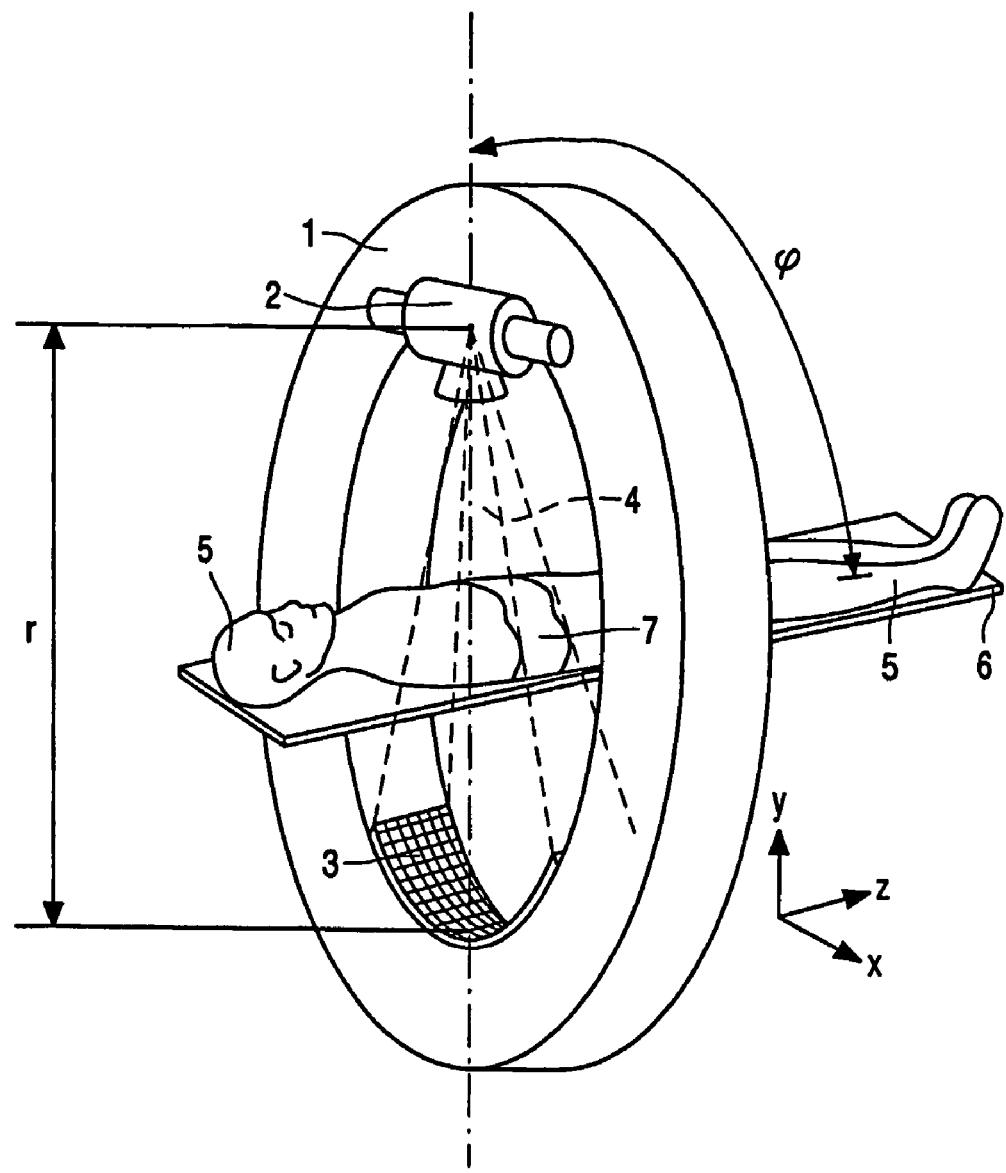

The invention pertains to an x-ray examination apparatus comprising an x-ray source and an x-ray detector, the x-ray detector including
a photoconductor to derive electric charges from incident x-radiation and
read-out elements which derive electrical pixel-signals from the electric charges from the photoconductor and
an output circuit to output the electrical pixel-signal.

Such an x-ray detector is known from the U.S.-patent U.S. Pat. No. 6,262,408.

The known x-ray detector is a two-dimensional image detector in which a Cadmium-Telluride or a Cadmium-Zinc-Telluride semiconductor layer is employed as the photoconductor. Such a semiconductor material has an excellent sensitivity for x-radiation. The known two-dimensional image detector comprises a plurality of pixel electrodes which form the read elements and collect electric charges that are generated in the semiconductor layer by incident x-rays. Further, the known two-dimensional image detector includes the output circuit which has an XY matrix form of electronic wiring and thin-film transistors (TFTs) which couple the pixel electrodes to the electronic wiring.

Although the sensitivity for x-radiation of the known two-dimensional image detector is adequate to excellent, the known two-dimensional image detector is not concerned with the rate at which successive image signals are produced that represent respective images.

An object of the invention is to provide an x-ray detector having a photoconductor layer which enables image signals to be produced at a higher rate than what the known two-dimensional image detector is capable to achieve.

This object is achieved by the x-ray examination apparatus according to the invention wherein
a central group of the read-out elements is located in a central region of the x-ray detector and
a peripheral group of the read-out elements is located in a peripheral region which surrounds the central region,
the x-ray examination apparatus being provided with
a selection system to select the central group of read-out elements so as to supply pixel-signals from the central group of read-elements to the output circuit.

Individual read-out elements include a collecting electrode which receives electric charges formed in the photoconductor. From the electric charges in the individual read-out elements, respective electrical pixel-signals are formed which represent the quantity of the electric charges in the individual read-out elements. The electrical pixel-signals are read-out by way of the output circuit.

Incident x-rays generate the electric charges in the photoconductor. The photoconductor is rendered locally electrically conductive at places where x-rays are incident. The incident x-rays cause formation of electron-hole pairs and charges of one polarity are collected at the collecting electrode of the read-out elements. The charges of the other polarity are carried-off to a counter electrode. According to an insight of the present invention, transient components of the electrical pixel-signals are caused by trapped electric charges which are released with a relatively long time-delay. Notably, these trapped electric charges are thermally released a relatively long time period after they had been generated. A further insight of the present invention is that such trapped electric charges occur mostly at the periphery, notably the edges, of the photoconductor. According to the invention, the x-ray examination apparatus is provided with the selection system to select the central group of read-out elements so as to supply electrical pixel-signals from the this central group of read-elements. Consequently, electric charges from the read-out elements of the peripheral region are not allowed to the output circuit. An output image signal is subsequently formed from the electrical pixel-signals that are supplied to the output circuit. Accordingly, transient components of the electrical pixel-signals are avoided in the output image signal and perturbations or corruptions of the output image signal due to such transient components are avoided to a large extent. Hence, the x-ray examination apparatus of the invention is able to produce the output image signal at a fast rate, so as to produce successive images of a high diagnostic quality at a fast rate. The high diagnostic quality implies that small details of low contrast are rendered well visible, in particular because image corruptions due to transient components of the electrical pixel-signals hardly occur.

These and other aspects of the invention will be further elaborated with reference to the embodiments defined in the dependent Claims.

In a preferred embodiment of the x-ray examination apparatus of the invention, the selection system has a shielding member which shields the peripheral region of the photoconductor from incident x-rays. Any electric charges generated in the peripheral region of the photoconductor are collected in the read-out elements of the peripheral group. Because the shielding member shields the peripheral region so that no or hardly any x-radiation reaches the peripheral region of the photoconductor, no or hardly any electric charges are collected in the read-out elements of the peripheral group. Consequently, the read-out elements of the peripheral group do not produce electrical pixel-signals so that transient components from these read-out elements are suppressed.

In another embodiment, the selection system has a shielding member with a collimator that is registered with the peripheral region of the photoconductor. This collimator intercepts x-radiation so that no or hardly any x-radiation reaches the peripheral region of the photoconductor. Hence, no or hardly any electrical pixel-signals are produced from the read-out elements of the peripheral group and transient components from these read-out elements are suppressed in the output image signal. Preferably, the collimator is adjustable so that the portion of the photoconductor that is shielded from x-radiation is accurately brought into correspondence with the peripheral region in which the generation of electric charges is avoided.

In another preferred embodiment, the selection system electrically isolates the peripheral group of read-out elements from the output circuit. Accordingly, any transient components from electric charges in the read-out elements of the peripheral region do not influence the electrical pixel signals applied to the output circuit. Hence, in the output image signal formed on the basis of the electrical pixels signals from the output circuit signal corruptions or perturbations by transient components are avoided. The output image signal has signal levels that represent brightness or intensity values at individual positions in the x-ray image received by the x-ray detector.

In another preferred embodiment the selection system includes an encompassing electrode which surrounds the central region. For example, the encompassing electrode is ring shaped such as in the form of a rectangle which may have rounded corners. The encompassing electrode is electrically connected to the read-out elements of the peripheral group. Any electric charges occurring in the read-out elements of the peripheral group are applied to the encompassing electrode and carried-off via the encompassing electrode. The read-out elements of the central region are not electrically connected to the encompassing electrode. Accordingly, any transient components from electric charges in the read-out elements of the peripheral region do not influence the electrical pixel-signals from the read-out elements in the central group.

The collecting electrodes of the peripheral group are preferably smaller than the collecting electrodes of the central group. Hence, available surface is made available to a larger extent to read-out elements which produce electrical pixel signals that are actually used to form the output image signal. Hence, saturation of the read-elements is avoided because the electrical capacitance is sufficient without the need of much enlarging the area of the entire x-ray detector. Only an enlargement to accommodate the small additional read-out elements of the peripheral region is needed.

Suitable photoconductors are e.g. a continuous crystalline semiconductor layer or a plurality of crystalline semiconductor elements. Good results are achieved when the semiconductor material is chosen from the group of Cadmium Zinc telluride (CdZnTe), Mercury Iodide ($HgI_2$) or lead oxide (PbO). When lead oxide is employed, notably good results are achieved with (nearly) lead oxide having a (nearly) stoichiometric composition. These semiconductor materials have a very high sensitivity for x-rays so that the x-ray detector of the invention is able to produce the output image signal that represents an x-ray image of a high diagnostic quality at a relatively low x-ray dose to the patient to be examined.

The x-ray detector of the invention is particularly suitable to be employed in an x-ray examination apparatus in which the x-ray detector receives an x-ray projection image from which it derives the output image, such as an electronic video signal. The radiation detector of the invention is also particularly suitable to be employed in a computed-tomography system in which the x-ray detector forms attenuation profiles from incident x-radiation which has passed through the object to be examined from several orientations. From these attenuation profiles an image data set is reconstructed representing local densities in the object. The image data set may relate to one or several cross sections through the object, but the image data set may also pertain to a reconstructed volume of the object to be examined. In particular the x-ray detector when employed in a computed tomography system is preferably arranged as a two-dimensional detector which can acquire attenuation profiles from several slices in the object simultaneously or which can acquire attenuation profiles from a cone shaped x-ray beam.

These and other aspects of the invention will be elucidated with reference to the embodiments described hereinafter and with reference to the accompanying drawing therein.

Figure 2:
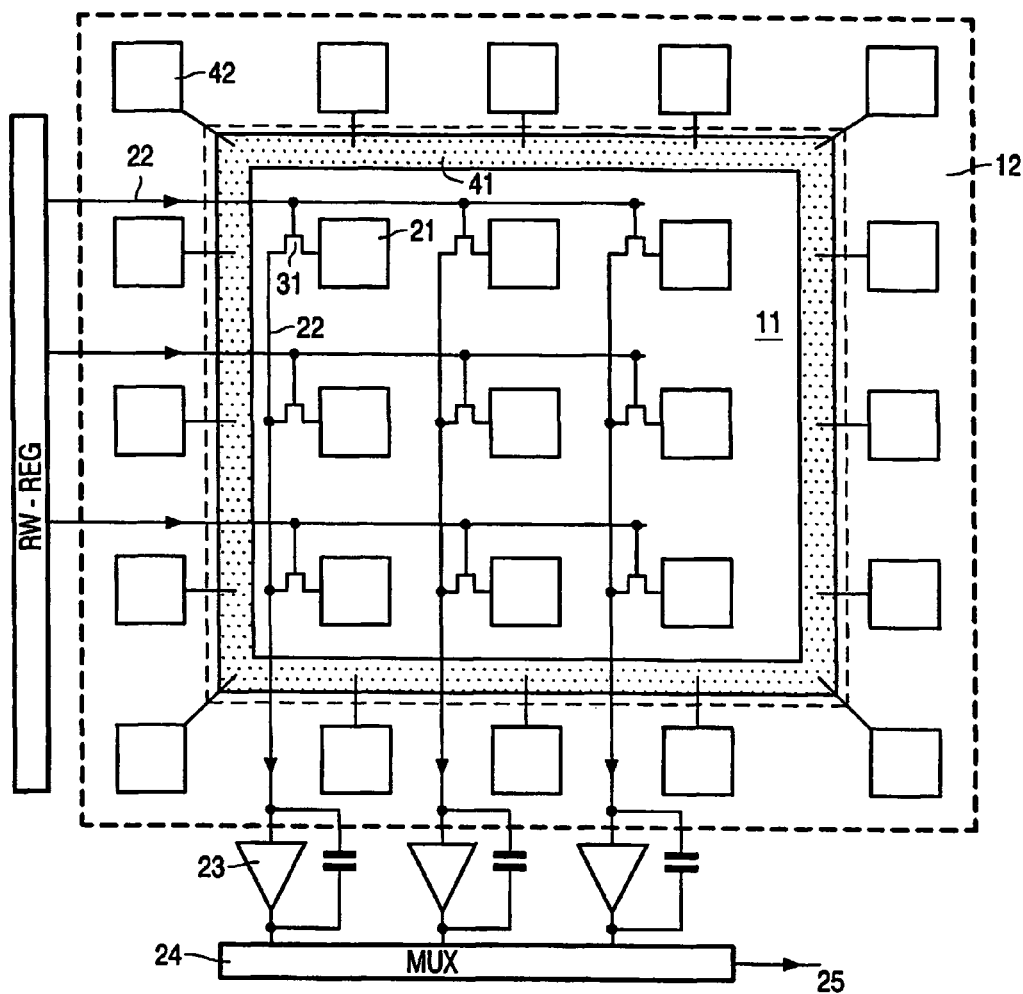
Figure 3:
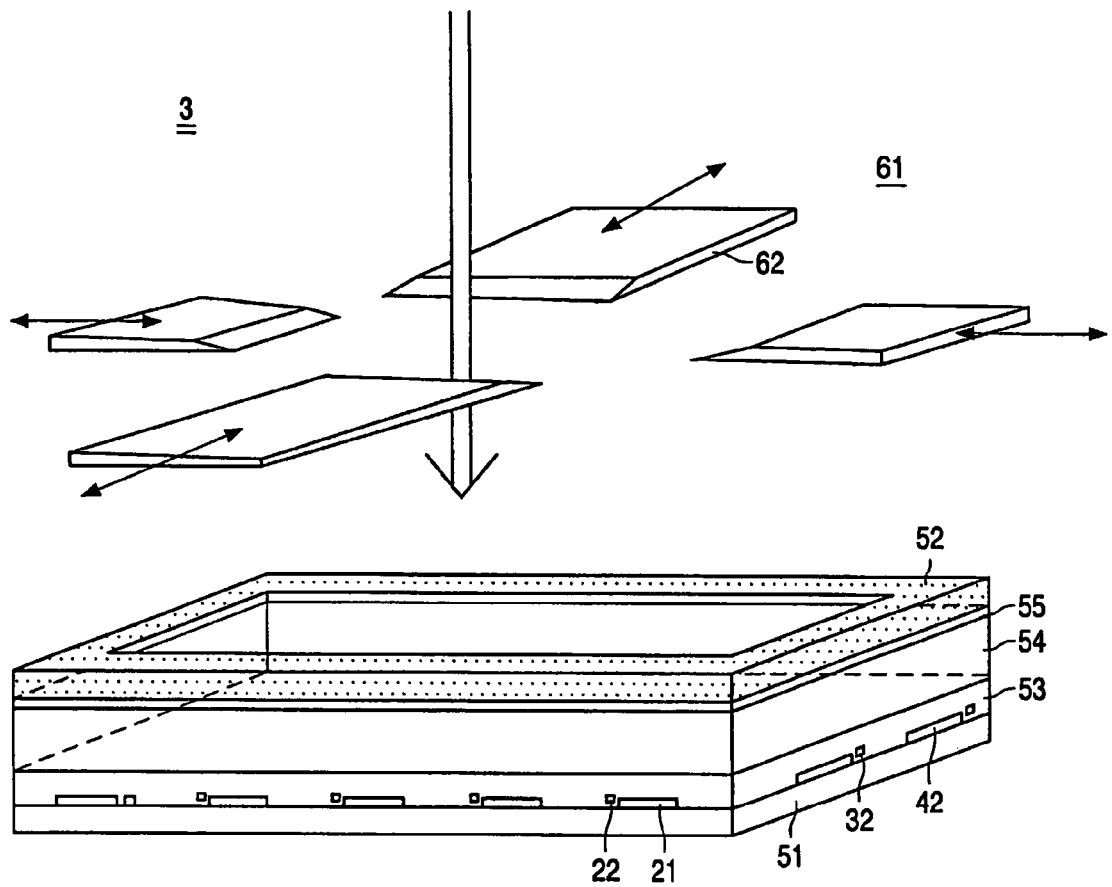

FIG. 1 shows diagrammatically a computed-tomography system with a multi-line detector in which the invention is employed, FIG. 2 shows a diagrammatic representation of the circuit lay-out of the x-ray detector of the x-ray examination apparatus of the invention and FIG. 3 shows a schematic representation of another embodiment of the x-ray detector of the x-ray examination apparatus of the invention.

FIG. 1 shows diagrammatically a computed-tomography system with a multi-line detector 3 which is formed as a detector array. The X-ray source 2 as well as the facing multi-line detector 3 are mounted in a circular portal frame or gantry 1. The X-ray source 2 emits a cone-shaped X-ray beam 4 through the patient 5 and onto the multi-line detector 3. The patient 5 to be examined is transported through the rotating gantry 1 on a table 6.

The detector array 3 is arranged at a distance r from the focus of the X-ray source 2. During a complete revolution of the gantry 1, the X-ray beam 4 irradiates the patient 5 in the gantry plane from different directions (p relative to the normal to form respective attenuation profiles which are received by the multi-line detector. A cross-sectional image 7 of the patient in the irradiated zone is reconstructed on the basis of these attenuation profiles.

The detector array 3 is composed of a plurality of detector elements which are arranged in a plurality of rows. These rows extend in parallel in the direction of the axis of rotation (z direction).

FIG. 2 shows a diagrammatic representation of the circuit lay-out of the x-ray detector of the invention. As an example an x-ray detector is shown having a group 11 of 3×3 read-out elements 21 in the central region. In practice a larger array may be used, for example 16×16 read out elements are used in an x-ray detector that is employed in a computed tomography system. The peripheral group 12 comprises 16 read-out elements 42 located around the central region. In the 3×3 central region there are 3×3 detector elements 21. Individual detector elements include a sensor element which converts incident x-radiation into electric charge and the read-out element 21 for example in the form of an electrical capacitance on which the electric charge is collected. For example the detector element includes a photoconductor and a collection electrode. For example the photoconductor element may be formed as a layer 54 of photoconductor material or as an array of crystals of photoconductor material such as Cadmium-Zinc-Telluride. In another example the photoconductor elements for several detector element may be formed as a continuous layer of photoconductor material such as mercury iodide or lead oxide. The read-out element stores the electric charge generated in the photoconductor on the electrical capacitance of the collection electrode.

The output circuit includes several read-lines 22 and read-out amplifiers coupled to the individual read-lines. Individual read-lines are provided for respective columns of detector elements and for respective columns there is a read-out amplifier 23 which is coupled to the read-line 22 at issue. The read-out amplifiers 23 of the respective columns are coupled to a multiplex-circuit 24 which forms the output image signal from the electrical output signals from the respective read-out amplifiers. The output image signal is supplied as an electronic video signal to an output port 25 of the x-ray detector. Individual detector elements are coupled to their read-out line by way of a switching element 31. For example the switching elements 31 are thin-film transistors which are coupled with their source contact to the detector element at issue and with their drain contact to the read-line of the column at issue.

For respective rows of detector elements there are provided addressing lines 32. Individual addressing lines are coupled to control contacts of the switching elements in the row at issue. Notably, the addressing line in a row is coupled to gate contacts of the thin-film transistors in that row. Addressing signals to open and close the thin-film transistors are applied to the gate contacts of the thin-film transistors. These addressing signals are provided by a row-register 33.

Around the 3×3 central group of detector elements there is provided the encompassing electrode 41 to which the read-out elements of the peripheral group are electrically connected. The read-out elements 42 of the peripheral group are essentially similarly constructed as the read-out elements of the central group. Preferably, the read-out elements 42 of the peripheral group 12 are smaller in size than the read-out elements of the central group. For example, the read-out elements in the central group have a linear size in the range of 0.5-2.0 mm and the read-out elements in the peripheral have a linear size in the range of 0.1-0.5 mm. Any electric charges, notably trapped electric charges that are accumulated mainly in the read-out elements of the peripheral group are carried-off by way of the encompassing electrode and hence cannot influence the output image signal at the output port 25. The encompassing electrode 12 is coupled to the substrate 51 of the x-ray detector so as to allow the electric charges from the read-out elements 42 of the peripheral group 12 to be drained to the substrate 51. The read-out elements 42 of the peripheral group 12 need to be provided with a switching element, but are permanently electrically connected with the encompassing electrode 41.

FIG. 3 shows a schematic representation of another embodiment of the x-ray detector of the invention. FIG. 3 shows a perspective side elevation of the x-ray detector of the x-ray examination apparatus of the invention. The x-ray detector is built-up on the substrate 51 on which an electronic circuit array 53 is formed which includes the read-out elements 42, 21 as collecting electrodes, the read-lines 22, addressing lines 32 and the switching elements. The photoconductor is formed in this example as a continuous photoconductor layer 54, for example of Cadmium Zinc Telluride. When as the photoconductor layer a CdZnTe layer of a thickness in the range of 2-6 mm is employed about 99% of the x-radiation is absorbed in the photoconductor layer. Excellent results are achieved with a CdZnTe layer of 3 mm thickness at an x-ray energy of about 140 kV. On top of the photoconductor layer a thin continuous counter electrode 55 is disposed. The bold arrow indicates the direction from which the x-radiation is incident on the x-ray detector, when in operation. The x-ray detector shown in FIG. 3 is provided with the shielding member 51 on the face of the x-ray detector facing the direction from which the x-radiation is incident. The shielding member 51 is provided over the periphery of the x-ray detector so that the read-out elements of the peripheral group are located under the shielding member, i.e. the read-out elements of the peripheral group at located at the side of the shielding member facing away from the incident x-radiation. The shielding member 51 may be formed as a metal rim covering the edge region of the photoconductor layer. Good shielding is achieved with a metal rim having a thickness in the range of 0.1-1.0 mm. Hence, in the edge region of the photoconductor layer there are no electric charges generated in this edge region. Hence, only electric charges are collected in the read-out elements of the central region. In the embodiment of FIG. 3 also the collimator 61 having several collimator plates 62 is shown. These collimator plates 62 are moveably mounted so that they are slideable along the directions of the arrows 63. The collimator plates 62 are placed such that they intercept the outer portions of the x-ray beam so that the collimator plates 62 shield the read-out elements 42 of the peripheral group 12 of read-out elements. The collimator 61 may be employed in combination with the shielding member 52 to achieve accurate shielding of the read-out elements of the peripheral region and allow x-radiation to pass to the detector elements of the central region. Moreover, good results for the shielding are also achieved by each of the shielding member and by the collimator separately.

The invention claimed is:

1. An x-ray examination apparatus comprising an x-ray source and an x-ray detector,
the x-ray detector having
a photoconductor to derive electric charges from incident x-radiation and
read-out elements that derive electrical pixel-signals from the electric charges of the photoconductor and
an output circuit to output the electrical pixel-signal from the read-out elements, wherein
a central group of the read-out elements is located in a central region of the x-ray detector and
a peripheral group of the read-out elements is located in a peripheral region that surrounds the central region,
the x-ray examination apparatus further having
a selection system to select the central group of read-out elements so as to supply pixel-signals from the central group of read-elements to the output circuit,
wherein the selection system includes an x-ray shielding member that shields the peripheral region of the photoconductor from incident x-radiation.

2. The x-ray examination apparatus of claim 1, further comprising a collimator between the x-ray detector and the x-ray detector, wherein the collimator has an x-ray absorbing member that is spatially registered with the peripheral region of the photoconductor.

3. The x-ray examination apparatus of claim 1, wherein the selection system has an encompassing electrode at least substantially surrounding the central region and electrically connected to the read-out elements of the peripheral group.

4. The x-ray examination apparatus of claim 1, wherein collecting electrodes of read-out elements of the peripheral group are smaller sized than collecting electrodes of the read-out elements the central group.

5. The x-ray examination apparatus of claim 1, wherein the selection system electrically isolates the peripheral group of read-out elements from the output circuit.

6. The x-ray examination apparatus of claim 1, wherein the photoconductor is a continuous semiconductor layer or the photoconductor includes a plurality of crystalline semiconductor elements.

7. The x-ray examination apparatus of claim 6, wherein the semiconductor layer or the semiconductor elements contain a photoconducting material from the group of Cadmium Zinc Telluride, Mercury Iodide or Lead Oxide.

* * * * *